United States Patent [19]

Baldi

[11] Patent Number: 4,617,202
[45] Date of Patent: Oct. 14, 1986

[54] DIFFUSION COATING MIXTURES

[75] Inventor: Alfonso L. Baldi, Wynnewood, Pa.

[73] Assignee: Alloy Surfaces Company, Inc., Wilmington, Del.

[21] Appl. No.: 310,085

[22] Filed: Oct. 9, 1981

Related U.S. Application Data

[63] Continuation-in-part of Ser. No. 302,979, Sep. 17, 1981, Pat. No. 4,464,430, and a continuation-in-part of Ser. No. 242,350, Mar. 10, 1981, and a continuation-in-part of Ser. No. 230,333, Feb. 2, 1981, Pat. No. 4,347,267, and a continuation-in-part of Ser. No. 25,456, Mar. 30, 1979, and a continuation-in-part of Ser. No. 71,741, Aug. 30, 1979, abandoned, and a continuation-in-part of Ser. No. 851,504, Nov. 14, 1977, abandoned, and a continuation-in-part of Ser. No. 809,189, Jun. 23, 1977, Pat. No. 4,308,160, said Ser. No. 242,350, and Ser. No. 230,333, each is a continuation-in-part of Ser. No. 89,949, Oct. 31, 1979, abandoned, said Ser. No. 89,949, and Ser. No. 71,741, and Ser. No. 25,456, each is a continuation-in-part of Ser. No. 963,313, Nov. 27, 1978, abandoned, and a continuation-in-part of Ser. No. 752,855, Dec. 21, 1976, Pat. No. 4,208,435, said Ser. No. 851,504, and Ser. No. 809,189, each is a continuation-in-part of Ser. No. 752,855, Dec. 21, 1976, Pat. No. 4,208,435, and a continuation-in-part of Ser. No. 694,951, Jun. 11, 1976, abandoned, and a continuation-in-part of Ser. No. 614,834, Sep. 19, 1975, Pat. No. 4,141,760, which is a continuation-in-part of Ser. No. 466,908, May 3, 1974, Pat. No. 3,958,097, and a continuation-in-part of Ser. No. 404,665, Oct. 9, 1973, Pat. No. 3,948,689, said Ser. No. 404,665, and Ser. No. 357,616, each is a continuation-in-part of Ser. No. 254,403, May 18, 1972, Pat. No. 3,785,854, and a continuation-in-part of Ser. No. 90,682, Nov. 18, 1970, Pat. No. 3,764,371, and a continuation-in-part of Ser. No. 219,514, Jan. 20, 1972, Pat. No. 3,810,357, said Ser. No. 90,682, and Ser. No. 219,514, each is a continuation-in-part of Ser. No. 837,811, Jun. 30, 1969, abandoned.

[51] Int. Cl.$^4$ .............................................. C23C 11/00
[52] U.S. Cl. .................................... 427/253; 75/252; 524/440; 524/441; 524/437; 501/127
[58] Field of Search ............... 524/441, 437; 427/252, 427/253; 75/252; 501/127

[56] References Cited

U.S. PATENT DOCUMENTS

3,784,407  1/1974  Shiio .................................. 427/96
3,801,357  3/1974  Baldi .................................. 427/282

Primary Examiner—Sam Silverberg
Attorney, Agent, or Firm—Connolly and Hutz

[57] ABSTRACT

Diffusion coatings can be masked from portions of a workpiece by combination of layers the outer one of which forms coherent strong shell that holds inner layer or layers in place. All ingredients of these layers can be materials such as nickel, nickel aluminide, chromium, chromic oxide ($Cr_2O_3$) and inert diluent, that do not contaminate superalloys or even low alloy or plain carbon steels. Layer can be deposited from suspension in a solution of film-former like and acrylic resin in readily volatilizable solvent such as methyl chloroform or chloroform. Innermost layer can be depletion-preventing and can be omitted. Such a holding shell can also be used to retain on a workpiece surface a layer that causes formation of a diffusion coating. Chromizing can be performed before aluminizing. Low alloy steel conduit can be internally chromized and/or externally chromized or aluminized to make it more desirable for use as high pressure steam boiler heat exchange tubing. Masking mixtures can be pastes extruded into place. Masking with resin-free masking powder while workpiece is subjected to gas-phase diffusion coating is particularly desirable.

6 Claims, 1 Drawing Figure

DIFFUSION COATING MIXTURES

This application is in part a continuation of applications Ser. No. 302,979 filed Sept. 17, 1981 (U.S. Pat. No. 4,464,430 granted Aug. 7, 1984), Ser. No. 242,350 filed Mar. 10, 1981, Ser. No. 230,333 filed Feb. 2, 1981 (U.S. Pat. No. 4,347,267 granted Aug. 31, 1982), Ser. No. 25,456 filed Mar. 30, 1979 (U.S. Pat. No. 4,349,612 granted Sept. 14, 1982), Ser. No. 71,741 filed Aug. 30, 1979 (subsequently abandoned, Ser. No. 851,504 filed Nov. 14, 1977 (subsequently abandoned) and Ser. No. 809,189 filed June 23, 1977 (U.S. Pat. No. 4,308,160 granted Dec. 29, 1981), of which '350 and '333 are in turn continuations-in-part of application Ser. No. 89,949 filed Oct. 31, 1979 (subsequently abandoned), and '949, '741 and '456 are in their turn continuations-in-part of application Ser. No. 963,313 filed Nov. 27, 1978 (subsequently abandoned) and of application Ser. No. 752,855 filed Dec. 21, 1976 (U.S. Pat. No. 4,208,435 granted June 17, 1980). The '504 and '189 applications are continuations-in-part of '855 as well as of application Ser. No. 694,951 filed June 11, 1976 (subsequently abandoned) and of application Ser. No. 614,834 filed Sept. 19, 1975 (U.S. Pat. No. 4,141,760 granted Feb. 27, 1979). Ser. No. 614,834 is a continuation-in-part of applications Ser. No. 466,908 filed May 3, 1974 (U.S. Pat. No. 3,958,047 granted May 18, 1976), Ser. No. 404,665 filed Oct. 9, 1973 (U.S. Pat. No. 3,948,689 granted Apr. 6, 1976) and Ser. No. 357,616 filed May 7, 1973 (U.S. Pat. No. 3,948,687 granted Apr. 6, 1976), the last two of which are continuations-in-part of applications Ser. No. 254,403 filed May 1, 1972 (U.S. Pat. No. 3,785,854 granted Jan. 15, 1974), Ser. No. 90,682 filed Nov. 18, 1970 (U.S. Pat. No. 3,764,371 granted Oct. 9, 1973) and Ser. No. 219,514 filed Jan. 20, 1972 (U.S. Pat. No. 3,810,357 granted Apr. 2, 1974), the two last-mentioned being continuations-in-part of application Ser. No. 837,811 filed June 30, 1969 (subsequently abandoned).

The present invention relates to the diffusion coating of metals.

Among the objects of the present invention is the provision of novel coating techniques and compositions for use therewith, as well as novel coated products, all suitable for commercial operations.

Additional objects of the present invention include compositions and techniques for confining protective diffusion coatings to desired locations on workpieces such as jet engine components to be protected by the coatings.

The foregoing as well as still further objectives of the present invention will be more fully understood from the following descriptions of several of its exemplifications, reference being made to the drawing FIGURE which is a sectional view of a diffusion coating technique typical of the present invention.

As pointed out in the earlier applications, a preliminary diffusion aluminizing of the ferrous metals greatly improves the corrosion resistance provided by top coatings. In some cases such diffusion aluminizing is best masked off from undesired portions of the surface of the workpiece being coated. Thus where the dimensional accuracy of a workpiece is, of a high order, such as on the root of a rotor blade that is to be securely received in a socket, it is frequently impractical to permit aluminizing of that root because the added aluminum increases the root's dimensions. Such masking problems arise more frequently with the superalloy components in the hot section of a turbine engine, where aluminizing is more widely practiced.

A particularly desirable masking technique according to the present invention, involves the coating of the portions to be masked with at least one layer of a dispersion of finely divided depletion-reducing masking solid and resin in a volatile solvent, evaporating off sufficient solvent to set the coating, applying over the set coating at least one stratum of finely divided non-contaminating solid particles that upon aluminizing become coherently held together to form a secure masking sheath.

The sheath-forming layer or one or more of the strata which constitute this layer, preferably have $Cr_2O_3$, nickel or mixtures of these two, as the particles that become coherently united by the aluminizing. Neither of these materials contaminate superalloy or stainless steel workpieces inasmuch as only chromium or nickel can be introduced into the workpieces from these sources, and these two metals are already present in the workpieces. Chromium and nickel are also not considered contaminants for low alloy steels, particularly those ferrous alloys containing at least 1% chromium.

The $Cr_2O_3$ and nickel particles are so actively effective that they can be diluted with as much as twice their weight of alumina or other inert filler, without losing their sheath-forming ability. While they can be used in undiluted form, it is preferred to dilute these aluminizable ingredients with some filler, at least about half as much filler as active material, by weight. Such dilution diminishes the amount of material that can consume the aluminizing aluminum, and also reduces the masking cost. Moreover undiluted coatings of $Cr_2O_3$ and resin tend to crack on drying.

For best masking of those aluminizing diffusions that are conducted at extremely high temperatures, e.g. 1900° F. or higher, it is helpful to have a three-layer masking combination in which the workpiece-contacting layer is of the depletion-reducing type, the next layer of the $Cr_2O_3$ type, and the outermost layer of the nickel type.

A feature of the present invention is that the masking materials are conveniently marketed as a kit of chemicals. Such a kit can for instance consist of a container holding a quantity of masking aluminide mixture, another container or two holding sheath-forming mixture or mixtures, a further container holding a solution of the resin in the volatile solvent, and if desired a still further container holding extra solvent.

EXAMPLE 1

A number of hot section first stage jet engine blades made of B-1900 nickel-base superalloy had their roots dipped in the following mixture:

| | |
|---|---|
| Powdered $Ni_3Al$ having 20 to 100 micron particle size | 111 g. |
| Powdered chromium having 20 to 100 micron particle size | 3.4 g. |
| Powdered alumina having 20 to 100 micron particle size | 111 g. |
| Poly(ethylmethacrylate) | 9 g. |
| Methyl chloroform | 123 g. |

The resin is first dissolved in the methyl chloroform, and the remaining ingredients then added with stirring to form a uniform suspension that does not settle very rapidly.

A single dip coating treatment with the suspension at room temperature, about 60° to 80° F., deposits a layer weighing about 130 milligrams per square centimeter after the methyl chloroform solvent is permitted to evaporate. Only a fraction of a minute is needed to complete such a coating, and it is helpful to repeat the dip several times until the combined coatings weigh about 500 milligrams per square centimeter. Dipping a previously dipped coating in the dispersion does not remove any significant portion of the previous coating, particularly if the previous coating had been permitted to dry at room temperature for at least about ½ minute.

After three or more dips as above, the thus-coated blades are dipped in the following coating mixture:

| | |
|---|---|
| Powdered nickel, 20 to 100 micron particle size | 175 g. |
| Powdered alumina, 20 to 100 micron particle size | 175 g. |
| Poly(ethylmethacrylate) | 4.7 g. |
| Methyl chloroform | 62.1 g. |

This dipping is repeated two more times, with intervening dryings at least about ½ minute long each, to build up the latter coating to about 500 milligrams per square centimeter. The blades were then promptly inserted in a pre-fired diffusion aluminizing pack having the following composition in parts by weight

| | |
|---|---|
| Powdered aluminum, 20 to 60 micron particle size | 10 |
| Powdered chromium, about 10 micron particle size | 40 |
| Powdered alumina, 20 to 60 micron particle size | 50 |
| Powdered $NH_4Cl$ | 0.3 | into which additional $NH_4Cl$ was blended to bring its concentration to the 0.3% value and make up for pre-firing volatilization. All of the blades were completely covered by the pack, and the mass was held in a diffusion coating retort. Diffusion coating was then carried out with a 6 hour hold at 1875° F. in the manner described in U.S. Pat. No. 3,785,854. The blades are then removed from the cooled retort and carry a hard shell-like sheath or crust where the roots had been covered with the masking dips. These crusts are quite adherent and coherent, so that the aluminizing pack is not materially contaminated by the masking layers, and can be reused for additional aluminizing without further precautions.

$Co_3Al$ or $Co_2Al$ or any of the other masking aluminides referred to in U.S. Pat. No. 3,801,357 can be used in place of the $Ni_3Al$ in the foregoing example, with somewhat poorer results. Although the cobalt aluminide masking powders give better results with cobalt-based substrates, those results are still not as good as the results obtained from the nickel aluminides.

The crusts are fairly brittle and can be readily removed from the blades by light blows of a hammer or even a wood club, or by blasting with an air-propelled stream of nickel shot. The crust fragments are discarded leaving the blade roots showing no aluminizing, and the balance of the blades with a 3 mil aluminized case.

The shell or crust formation is due to the fact that the nickel powder in the outermost masking layer undergoes so much aluminizing that these powder particles grow together. The dilution of the nickel with as much as four-thirds its weight of inert material such as alumina does not prevent such growing together, and neither is it prevented by the presence of the resin in the dipped masking composition. Such resin is completely driven off during the initial portion of the diffusion coating heat, but the relatively small amount of such resin would not significantly affect the results even if it were to survive the diffusion heat or were carbonized by that heat.

The diluted $Ni_3Al$ in the lower layers of masking does not aluminize sufficiently to cause shell or crust formation, even though those layers also contain a small amount of chromium that by itself would form a shell. Any metal-containing layer in contact with a workpiece should contain at least 25% inert non-metal such as the alumina, or kaolin, to assure that the metal of the layer does not sinter to the workpiece, and such dilution also keeps the $Ni_3Al$ from forming a shell or crust.

On the other hand, other aluminizable powders that are essentially inert to the workpiece but form shells, can be used in place of or in addition to the nickel powder in the shell-forming layers. $Cr_2O_3$ is another such shell-forming material, apparently undergoing some conversion to aluminized metallic chromium. Being less expensive than nickel, $Cr_2O_3$ is particularly desirable for use where masking expenses are to be minimized. Mixtures of nickel and $Cr_2O_3$ can be used with an effectiveness corresponding to that of each individually and indeed a small amount, such as 5%, of $Ni_3Al$ can be mixed with the nickel or the $Cr_2O_3$ without detracting significantly from the results.

All diluents can be omitted from the shell-forming layers, if desired, but this makes it more important to be sure that at least the minimum effective amount of shell-forming layer is applied. In undiluted condition only about 100 milligrams per square centimeter of nickel or $Cr_2O_3$ is needed, and the presence of the resin adds so little to the shell-forming layer that it has no significant effect on the amount of shell-forming layer needed. Layers deposited from undiluted $Cr_2O_3$ suspended in a resin solution, tend to crack on drying, whereas there is no such cracking when the $Cr_2O_3$ is diluted with at least about ¼ its weight of $Al_2O_3$ or other diluent. When inert solid diluent such as alumina, resin or even $Ni_3Al$ is used with nickel powder, such diluent is preferably not over about 50% by weight of the nickel in the sheath-forming layer. The resin content is preferably not over about 4% of the weight of the layer.

The resin in the outer layers acts to keep the masking layers from rubbing off onto or into the diffusion coating pack during the packing. Thus a stratum of nickel powder, with or without alumina, can be applied over the $Ni_3Al$-chromium-resin lower masking layers as by rotating the blades coated with those masking layers in a falling stream of powdered nickel so that falling powder particles adhere to the resin-containing lower masking layers. This is however not nearly as simple as the application of the outer masking layers by dipping, its uniformity is not as good, and some of the falling powder so adhered tends to rub off when the workpieces are handled and when the diffusion coating pack is poured over them.

After the first dip or two to apply resin-containing masking layers, some or all subsequent dips can be effected in resin-free suspensions of the coating materials in a solvent that dissolves the resin in the previously applied layers. Inasmuch as coating syspensions entirely free of resin are more difficult to maintain uniform, a little resin or other viscosity-increasing material can be added to such dispersions to reduce the settling rate of the dispersed powders.

It is also helpful to use a combination of shell-forming masking layers in which some are of the type that depend on the presence of nickel powder, and others are of the type that depend on the presence of $Cr_2O_3$ powder. Thus it is particularly desirable for aluminizings that are effected at about 2000° F. or higher, for the shell-forming combination of layers to have the lowermost such layers based on $Cr_2O_3$ and built up to at least about 300 milligrams per square centimeter, while the uppermost are based on nickel powder and are also built up to at least about 300 milligrams per square centimeter. It is not desirable for the $Cr_2O_3$ layers to be in contact with the substrate metal.

While other resins and solvents can be used to make the masking layers of the present invention, the acrylic resins are preferred and poly(ethylmethacrylate) is particularly preferred because it gives such good dip coatings and clean products. Methyl chloroform is also a particularly preferred solvent inasmuch as it has the desired solvent action combined with good evaporation characteristics and low use hazard. Some acrylic copolymers are not sufficiently soluble in methyl chloroform, and for such polymers acetone or methyl ethyl ketone or methylene chloride can be used as the solvent. Any other resin that forms a cohesive film can be used, even wax, so long as it does not contribute contamination as by silicon present in silicone resins.

For the masking it is very desirable to have a kit or package of the combination of masking materials. Thus an assembly of three containers can be packaged as a masking kit, one container having the depletion-reducing masking powder mixture of $Ni_3Al$ with chromium and inert diluent, a second container having the non-contaminating sheath-forming mixture, and the third container a solution of non-contaminating film-former in the volatile solvent. This solution preferably has a resin content of not over about 8%, and at least about 2%, by weight.

Where the quantity of film-former solution is so large that this solution can be used over a period of time and can lose substantial amounts of its solvent by evaporation before all of the solution is used, the kit can be expanded to include a fourth container that holds fresh solvent with or without a little of the film-former.

Where two different kinds of sheath-forming mixtures are to be used, an extra container holding the second such mixture is added to the kit. The kit can thus have five different containers if no fresh solvent supply is included, or six different containers if such supply is included.

The composition of the depletion-reducing masking mixture can vary in the manner described in U.S. Pat. No. 3,801,357. Thus the aluminide can be nickel or cobalt aluminide containing between ⅓ and ¾ atom of aluminum for every atom of nickel or cobalt, the inert particles can range from about ¼ to about ⅜ of this mixture by weight, and the chromium content can range from about ¼ to about 3% of this mixture by weight.

The foregoing masking is very effective to prevent the aluminizing of the masked surfaces. It also serves to mask against chromizing. The following example demonstrates a very effective chromizing combined with a masked aluminizing.

EXAMPLE 2

A batch of first stage PWA 1455 blades for the hot section of a jet engine are cleaned by degreasing in trichloroethylene and then lightly blasting with 220 grit alumina propelled by an air jet at 30 psig. The blades so cleaned are embedded in the following pack, all percentages being by weight

| Powdered chromium | 1.2% |
| Powdered nickel | 2.4% |
| Powdered aluminum | 0.37% |
| Powdered alumina | 96.03% |

All of the powders were minus 325 mesh, their particle sizes ranging from about 20 to about 50 microns, and the mixture well homogenized with repeated siftings, then further mixed with ½% $NH_4Cl$ and ½% $MgCl_2$ and placed in a chromized steel retort before the blades are packed. The packed retort was then covered by an outer retort as described and illustrated in U.S. Pat. No. 3,785,854, care being taken that the outer retort has no leaks and is well sealed. The atmosphere in the outer retort is displaced by a stream of argon introduced through an inlet conduit opening near the bottom of the interior of the outer retort and exited through an outlet conduit opening near the top of the interior of the outer retort. Heating of the retort is initiated and the flow of argon maintained through the entire heat at a rate that assures essentially no entrance of air or moisture into the interior of the retorts. Where the outer retort has no leaks, an argon flow of about 5 standard cubic feet per hour is adequate.

The pack is held at 1900° to 1950° F. for 30 hours after which heating was terminated and the retorts permitted to cool, the argon stream being maintained. The retorts can be opened when the pack temperature cools to about 300° F., the blades unpacked, cleaned with a blast of air, and washed with water.

The blades have a very good chromized case 0.6 to 1.2 mils in depth, with no alphachrome and no objectionable oxide increase seen on metallographic examination.

The foregoing chromizing pack is used without a breakin heat, and has so little metal content that it can be discarded after a single use. If desired, its metal content can be salvaged as by pouring a stream of the used pack through a horizontally moving air stream which deflects away the lighter particles, permitting the metal particles to be collected.

The pack of Example 2 can be modified by incorporating in it about 0.1% magnesium. Chromized cases produced by a pack so modified have even less undesirable oxide visible on metallographic examination, and are of particularly high quality.

In general the pack of Example 2 can have a chromium content of from about 0.6 to about 2%, a nickel content from about ½ to about 3 times the chromium content, and an aluminum content about 1/10 to about ⅓ the chromium content. The argon atmosphere of that example can be replaced in whole or in part by helium, neon or other inert gas or mixtures thereof. Other insert diluents like kaolin can be substituted for the alumina in its pack.

The used diffusion coating packs of Example 2 contain a small amount of nickel-aluminum-chromium alloy and can be utilized as masking mixtures in low-temperature aluminizing, that is aluminizing conducted at not over about 1400° F. Thus the used pack can be mixed with 1/5 its weight of a 6% solution of poly(ethylmethacrylate) and the mixture applied by dipping over the roots of the blades chromized in Example 2, to build up a coating weighing 500 milligrams per square centimeter. The masked blades are then embedded in the following powder pack, the percentages being by weight:

| Alumina | 85% |
|---|---|
| Aluminum-silicon alloy (88% Al) | 15% | to which is added ½% NH₄Cl.

A coating heat in hydrogen with a 30 minute hold at 1350° F. deposits a 10 milligram per square centimeter coating over all unmasked surfaces. The blades are then removed from the pack, the masking mixture brushed off, and then heated in hydrogen having a minus 35° F. dew point for 4 hours at 1975° F. to diffuse the aluminum coatings into the surfaces. They are then rapidly air cooled to below 1000° F., aged for 10 hours at 1600° to 1650° F. and again rapidly air cooled to give blades ready for use with roots only chromized and with their airfoil surfaces chromized and then aluminized.

The combination of pack coating followed by a subsequent diffusion outside the pack is also helpful to provide a combination of two diffusion layers, one richer than the other.

As pointed out above, a particularly desirable masking technique involves the coating of the portions to be masked with at least one layer of a dispersion of finely divided depletion-reducing masking solid and resin in a volatile solvent, evaporating off sufficient solvent to set the coating, applying over the set coating at least one stratum of finely divided non-contaminating solid particles that upon aluminizing become coherently held together to form a secure masking sheath. It is also helpful to have the masked surface only in contact with an essentially inert layer such as inert diluent, or inert diluent mixed with a small amount, not over about 5% of depletion-preventing material such as powdered chromium. This depletion-preventing material helps keep chromium and other key alloying ingredients of the masked surface from diffusing out of that surface. Such an essentially inert surface-contacting layer is also helpful in the masking of aluminum diffusions that are conducted at temperatures as low as 1100° F.

The most elaborate masking arrangement of the present invention uses a three-layer masking combination in which the workpiece-contacting layer is of the essentially inert type, the next layer of the masking type, and the outermost layer of the sheath-forming type. Nickel aluminides present in any masking layer other than a sheath-forming layer, should have no more than about 3 atoms of aluminum for every four atoms of nickel.

A kit of chemicals for such combination can have a container holding a quantity of inert layer mixture, in addition to containers holding mixtures for the other layers and a container for the resin solution, etc.

To make the masking layers easier to apply, it is helpful to add to the resin solution a little long-chain-hydrocarbon acid such as stearic acid that helps keep the particles of the masking composition dispersed in the volatilizable organic solvent in which they are suspended. As little as about 0.1% of such dispersing aid based on the total weight of the suspension, is enough to impart very good flowability so that the painting, or even dipping of the workpieces, is simpler and produces a more uniform masking layer. However dispersing aid concentrations of at least about 0.3% to about 0.5% are preferred, and as much as 1% can be effectively used.

Hydrocarbon chain lengths as short as 12 carbons and as long as 50 carbons or more are suitable for the dispersing aid. Thus lauric acid, myristic acid, oleic acid, and even copolymers of ethylene and acrylic acid, are effective. The dispersing aid should also be soluble in the solvent in which the masking composition is suspended.

The effectiveness of the dispersing aid is increased by also dissolving in the suspension a small amount of a surface-active agent, preferably a low-foaming non-ionic surface-active agent such as polyethoxy ether of a linear primary alcohol like cetyl alcohol, or of an alkyl phenol. Only about 0.1% of surface-active agent is all that is needed. It should be noted in this connection that the surface active agent when added without the long-chain-hydrocarbon acid, has substantially no effect on the masking suspension.

The masking compositions of the present invention can be used to prevent chromizing or to prevent aluminizing. The nickel and/or nickel aluminide in the masking layers combines with either chromium or aluminum or both and in this way prevents significant penetration of either of these metals to the workpiece surface on which the masking is applied.

The essentially inert layer of the masking combination need only weigh about ⅛ gram per square centimeter to improve the masking action by preventing roughening of the workpiece surface being masked. That layer can also weigh as much as about 2 grams per square centimeter, and can be composed of inert materials such as alumina, kaolin or MgO. The presence of about ½ to about 5% chromium metal in the essentially inert layer or in the layer above it, contributes a strong depletion-reducing effect.

The following illustrates a more elaborate masking technique.

EXAMPLE 3

A group of hot section turbine engine blades of U-520 alloy (0.05% C, 19% Cr, 12% Co, 6% Mo, 1% W, 3% Ti, 2% Al, 0.005% B, the balance Ni) have their roots masked by dipped coating of three superimposed layers as follows:

first layer—a slurry of 2300 grams of 10 to 20 micron particles of alumina in 1300 grams (1000 cc) of a 7% solution of poly(ethylmethacrylate) in methyl chloroform containing 0.5% stearic acid. Three dips are used to provide a layer containing about 350 milligrams of non-volatiles per square centimeter of surface, and the layer is then permitted to dry by exposure to the atmosphere for about 20 seconds.

second layer—a slurry of 20 to 50 micron particles of Ni₃Al, similarly sized particles of Cr and 10 to 20 micron particles of alumina in the foregoing methyl chloroform solution or resin and stearic acid. The slurry contains 50 grams Ni₃Al, 5 grams Cr and 45 grams alumina for every 50 cc. of the foregoing solution, and two dips are used to provide about 400 milligrams of non-volatiles per square centimeter of surface. This layer is then permitted to dry.

third layer—a slurry of 20 to 50 micron particles of Ni, similarly sized particles of Ni₃Al and 10 to 20 micron particles of alumina, suspended in the foregoing methyl chloroform solution of resin and stearic acid. The slurry contains 75 grams Ni, 13 grams Ni₃Al and 12 grams Al₂O₃ for every 33 cc. of the foregoing solution, and is brushed on to deposit a layer thickness containing about 600 milligrams of non-volatiles per square centimeter of surface. The resulting layer is also permitted to dry.

The slurries are shaken before dipping and before the brushes used for brushing are dipped into them. A little shaking keeps the slurries well dispersed for the few minutes needed to do the dipping or brushing, and each brush stroke applies a uniform slurry stratum that can be built up to the desired total layer-thickness by an overlying brush stroke or two. Expert brush manipulation is not necessary.

The blades with the dried three-layer masking on their roots are then diffusion aluminized, and even at aluminizing temperatures as low as 1700° F. such combination forms the hard shell that remains in place and keeps the masking from significantly contaminating the surrounding diffusion-coating pack. The masking is in the form of a hard crack-free shell locked around each blade root. Striking this shell with a wooden mallet or rod breaks the shell into small pieces that do not adhere to the workpiece, and drop off revealing a smooth bright root surface free of diffusion coating. The balance of the blade shows a good diffusion case 4 mils deep.

Such hard shell protection is also formed when the first of the three masking layers, that is the essentially inert layer, is omitted, but the masked workpiece surface is then apt to be not quite as smooth and bright, particularly when the diffusion coating is effected at very high temperatures. With or without the essentially inert layer, at least about 50 milligrams of Ni₃Al or similar nickel aluminide per square centimeter of masked surface assures the most effective masking, and this can be applied with or without the metallic chromium, and with or without the alumina or other inert diluent in the masking layer. When used without the chromium and without the foregoing first layer, some loss of chromium takes place from masked superalloy surfaces. Without its inert diluent the masking layer becomes more expensive unless its thickness is reduced so that more care is needed to assure its proper application.

In general, a slurry used to apply a masking layer should have at least about 20 volume percent and up to about 70 volume percent suspended solids.

For diffusion aluminizing at temperatures below about 1100° F. or diffusion chromizing at temperatures below 1900° F., masking is very effectively provided without the first layer and without significant roughening of the masked surface. The small amount of roughening produced when aluminizing at temperatures as high as 1500° F. can frequently be tolerated. When masking workpiece surfaces of cobalt or cobalt-base alloys, cobalt aluminides can be used in place of nickel aluminides. However the foregoing three-layer or two-layer masking is also effective when diffusion chromizing plain carbon and low alloy steels.

In general, the masking layer should contain powdered nickel or powdered nickel aluminide or powdered cobalt aluminide, preferably diluted so that it constitutes up to about 90% of the layer, and at least about 25% of the layer, by weight. However, for masking superalloys, where depletion is to be avoided, elemental nickel should not be used in a layer contacting the masked surface or having only an essentially inert layer between it and the masked surface. In such use the masking ingredient should be a nickel or cobalt aluminide having between ⅓ and ¾ atom of aluminum for every atom of nickel or cobalt.

Similarly a sheath-forming layer can have a nickel or Cr₂O₃ content of from about 50 to about 100%, and when it contains nickel can also contain aluminum in an amount up to equiatomic with the nickel.

The foregoing percentages do not take into account the resin bonding agent and the like that holds the layers in place but is driven off during the diffusion coating.

The second of the masking layers of Example 3 can be omitted and only the first and third layers used when masking against aluminizing and particularly when aluminizing stainless or low alloy steels.

The sheath-forming layer can be used as a very effective mask without any other helping layers, when aluminizing at temperatures below 1100° F. Sheath formation seems to be caused by the sintering together of the nickel particles in the third masking layer, under the influence of the diffusion atmosphere which causes diffusing metal to diffuse into the nickel of these particles. These particles thus grow in size. The Cr₂O₃ particles appear to form some chromium metal that becomes aluminized and sinters to a sheath.

Sheath formation can also be effected by adding to the sheath-forming layer a metal powder like aluminum the particles of which sinter to the nickel particles. Excessive addition is to be avoided to keep the added metal from contaminating the workpiece. Thus an aluminum addition of this type should contribute no more than about one atom of aluminum for every atom of nickel. As little as one one-hundredth of that proportion of aluminum helps the sheath formation, particularly where only a light diffusion is being performed.

The sheath-forming layer can be used to lock masking mixtures about a workpiece surface by partially or completely enveloping that surface. However such sheath formation will also securely hold a masking mixture against a portion of a flat or concave workpiece surface, particularly when such a combination is embedded in a powder pack in a diffusion coating retort.

Other inert diluents such as kaolin or MgO can be substituted for some or all the alumina in each of the foregoing formulations.

It is convenient to have a kit of masking materials for selective use as needed. Thus one such general utility kit contains separately packaged the inorganic ingredients or ingredient mixtures of the three masking layers of Example 1, along with a separate quantity of the methyl chloroform solution and a separate quantity of methyl chloroform make-up to replenish slurries that have lost excessive solvent through evaporation. The appropriate inorganic ingredients can then be selected and added to the methyl chloroform solution to make any or all of the foregoing layer-forming slurries.

A very desirable kit of this type has
(a) a quantity of diffusion-masking powder,
(b) a quantity of sheath-forming powder, and
(c) a solution of a binder in a volatile organic solvent, the quantities being so related that the sheath-forming powder is sufficient to form a continuous layer over a continuous layer of the diffusion-masking powder, and the solution forms a workable slurry with both powders.

Such a combination can have for example:

2000 grams of the diffusion-masking mixture of Ni₃Al, chromium and alumina described for the first coating layer of Example 1;

3000 grams of the sheath-forming mixture of Ni, Ni₃Al and alumina described for the third layer of Example 3; and one liter of the resin solution of Example 3.

For special situations, one or more of the foregoing ingredient units can be omitted from a kit.

The fragments of sheath broken away from the workpiece after the diffusion coating is completed, can contain large quantities of nickel, and such nickel can be recovered from the fragments, if desired, as by dissolving it out in acid and separating the dissolved nickel from dissolved aluminum by ammoniacal precipitation of the aluminum. Alternatively, the fragments can be crushed into powder, their inert diluent such as alumina separated from the crushed powder by dropping that powder through a horizontally moving airstream that deflects the less dense diluent more than the more dense metal, melting the resulting metal with sufficient freshly added aluminum or nickel to convert the melt to Ni₃Al for reuse as such.

Omitting the stearic acid from the slurries used to apply the masking layers makes it more difficult to keep the slurries uniformly suspended and calls for the slurries to be shaken frequently to reduce settling.

Using the first and/or second masking layers without the third layers causes the applied masking layer or layers to develop cracks and gaps during the diffusion heating as a result of the thermal driving off of the binder resin. This causes the masking to be unreliable.

Omitting the nickel from the outermost of the three layers keeps it from forming the desired protective shell, unless the omitted nickel is replaced by Cr₂O₃. The remaining ingredients of the outermost layer make it more generally effective and easier to apply, but are not essential.

The substitution of other acrylic resins such as poly (ethyl acrylate) or similar binder resins for the poly (ethyl methacrylate) of Example 3 does not materially change the results. Other solvents such as toluene can also be substituted for the methyl chloroform, but the methyl chloroform has a combination of non-flammability, volatility and lack of health hazard, that makes it particularly desirable.

The outermost or sheath-forming layer of the masking combination makes a very effective retaining or securing means that assures the locking of other types of layers beneath it onto the workpiece surface through the coating heat. The same securing action can be used to hold a slurry coating layer instead of a masking layer onto the workpiece. This is illustrated in the following example and makes it unnecessary to have the workpiece embedded in a coating pack.

EXAMPLE 4

A 5-foot length of steam generator high pressure tubing of Croloy alloy (1.9 to 2.6% Cr, 0.97 to 1.13% Mo, 0.15% C, balance essentially iron) having a ¾ inch bore and a ½ inch wall was thoroughly cleaned inside and out, and had its bore filled with a chromizing pack composed of a previously broken-in mixture of 10% chromium powder the particle sizes of which range from about 10 to about 20 microns, and 90% tabular alumina granules having a particle size ranging from about 100 to about 300 microns to which mixture was added ½% NH₄Cl granules as an activator. The breaking-in was effected by a mixture of the foregoing three ingredients in a retort in the absence of a workpiece, to 1800°–1850° F. for 10 hours under hydrogen. The tube so filled had its ends capped with 1010 steel caps frictionally fitted over the tube ends so as to provide semi-gas-tight covers.

The outside surface of the tube was then painted with the following layers in succession, drying the first layer for a few minutes before applying the second:

first layer—600 grams of a previously broken-in mixture of 45% Cr, 45% alumina and 10% Al, to which ½% NH₄Cl is added before as well as after break-in as described in U.S. Pat. No. 3,801,357, suspended in 200 cc of methyl chloroform solution containing 7 weight percent of a copolymer of 70% ethyl and 30% methyl methacrylates, 0.5 weight percent stearic acid and 0.1 weight percent cetyl ethyl of decaethoxy ethanol. Four applications of this mixture are made with intervening drying to build the non-volatile coating to 1200 milligrams per square centimeter of tube surface.

second layer—600 grams of a mixture of 68.5% Ni powder and 31.5% Al powder, dispersed in 150 cc of above methyl chloroform solution. The metals of this slurry were not pre-fired, and only two applications of this slurry were made to provide a non-volatile coating weight of about half that of the first layer.

The tube so prepared was placed in a tubular retort of a diffusion coating furnace assembly having inlet and outlet connections for a hydrogen-blanketing as in U.S. Pat. No. 3,801,357 and then subjected to a diffusion coating heat of 1800° F. for 10 hours. After cooldown at the end of the heat, the tube end caps were removed, the pack in the tube bore poured out, and the sheath around the exterior of the tube broken off and removed. The interior of the tube was effectively chromized with a case 1.8 to 2.3 mils thick, and the outside of the tube aluminized with a case about 24 mils thick.

The chromized case included an outer portion about 0.3 mil thick rich in chromium carbide, and an inner portion of columnar chromized structure. This case is particularly effective in reducing erosion of the internal tube surface by rapidly moving high pressure steam.

The aluminized outer surface prolongs the life of the tube in a coal- or oil-fired furnace where it is subjected to combustion atmospheres at temperatures as high as about 1000° F.

The internal pack is a highly fluent composition that is easily poured into place before the heat, and is readily removed afterwards, using a minimum of mechanical poking and the like. Such a pack is particularly desirable for packing of cramped recesses in the interior of workpieces, such as in the narrow bores described above, or in hollow jet engine blades, or the like.

The noted fluency is brought about because the alumina granules, which are crushed from alumina which has been melted and solidified, are quite fluent and show a flow angle of about 45 degrees. This is the angle of incline (measured from the horizontal) of a cone made by pouring a stream of the granules onto one spot to build up a cone. The fluency can be increased by selecting aluminas or other inert particles having an even smaller flow angle. Thus alumina microspheres having particles sized about 100 to about 500 microns are exceptionally fluent. Tabular alumina, which can be made by sintering alumina powder and then crushing, is also fluent, and is preferred because it tamps in place better and then during the diffusion coating does not shrink from the surface against which it is tamped.

The pack need only have about ½ its volume of any of the foregoing fluent materials. Thus the chromium particles by themselves need not be fluent at all, and will provide a suitable fluent pack when ½ of the pack is constituted by the fluent granules or microspheres. Similarly non-fluent alumina or other non-fluent inert material can be present in the pack with or without non-fluent chromium powder, without detracting significantly from the fluency provided by the foregoing volume of fluent material.

The fluent diffusion coating packs are also highly beneficial for use in chromizing bent small-bore tubing. Thus for some steam-generating arrangements lengths of steam-generating tubes have one end bent back 180 degrees to form cane-shaped units which can have their ends welded to additional lengths to form a continuous furnace tube assembly. The packing of the bores of such "canes" for diffusion coating, and the subsequent pack removal after coating, is greatly simplified by the use of fluent packs.

Fluent packs are very helpful when the workpiece being coated has a portion of its surface masked to prevent coating there. For such masking the shell-forming masking materials are highly desirable, and the fluent coating pack makes it easier to recover the masked workpiece at the completion of the coating operation with their masking intact. Little or no mechanical working of the fluent pack is needed to remove it from the retort and thus expose the masked workpieces. Thus a used fluent pack is readily removed from the interior of a narrow pipe, for instance, by pushing a narrower tube into the pipe bore and blowing air through the tube as it moves into that bore.

Fluent coating packs also do not require much tamping into place and this reduces the chances of disturbing the masking when masked workpieces are loaded into a retort at the beginning of a coating operation.

The external surfaces of boiler tubing are also made more resistant to corrosion as a result of the aluminizing or the chromizing described above, even the minor chromizing effected when only the interior of such a tube is packed with the diffusion chromizing mix.

As pointed out, the shell-forming layer used to hold a slurry coating in place where there is not much of an aluminizing or chromizing atmosphere, contains non-contaminating materials that sinter together under coating conditions. Thus nickel and aluminum powders smaller than about 500 microns in size and in an atom proportion from about 1:0.9 to about 1:1.1 are very effective. Chromium can be substituted for the nickel in such a mixture. Because of the non-contaminating character, a diffusion coating pack will not be ruined in the event a small amount of the masking materials should inadvertently become mixed into it.

Fluent diffusion coating packs are also very helpful even when they are used without insertion into cramped spaces. Thus in diffusion coating of the outer surface of turbine vanes or blades in the standard arrangements such as shown in U.S. Pat. No. 3,764,371 or in glass-sealed retorts as in U.S. Pat. No. 2,844,273, a fluent pack is simpler to load into a retort, simpler to embed the work in and far easier to remove from the retort after the coating heat is completed. For such use the fluent particles can have repose angles of as much as 55 degrees, and can constitute as little as about 40% of the pack by volume, although the greater fluency of the packs having at least half of the particles with the 45 degrees repose angle, are preferred.

It is not necessary to diffusion coat the external surfaces of such tubes or to diffusion coat those external surfaces with aluminum. The internal bores of such tubes can be chromized for instance without the use of a covering layer on their exterior. Such chromizing in the retort arrangement described in Example 2 will produce a distinct outer chromized case in addition to the above-described internal case, but the outer case will generally not show the carbide stratum and will have less chromium pick-up.

The foregoing inner and outer coatings can be applied to tubes as long as 40 feet or more in length, whether those tubes be straight or cane-shaped. For such long tubes it is desirable to effect the diffusion coating uniformly along the tube lengths, and to this end the diffusion coating temperature along the length of the tube can be closely controlled. Thus a plurality of the tubes each with its bore packed and its ends capped can be inserted lengthwise in a tubular open-ended retort sufficiently narrow to make a snug container for the tubes. One or more of the tubes is also fitted with a number of thermocouples on its exterior and distributed along its length. The retort so loaded can then be inserted in a furnace having a number of gas burner rings spaced along the retort's length, each ring encircling the retort. Only one end of the retort need be open, and that end can be sealed with a head that has a number of passageways. Some of these passageways are used for the passage of thermocouple connection wires, and two can be used as inlet and outlet respectively, for a bathing gas such as hydrogen.

The operation of the burner rings is then adjusted to bring all the thermocouples to the desired temperature. Should there be a temperature variation among the thermocouples, individual burners can be further adjusted. In this way a cool thermocouple can have its temperature brought up by turning up the nearest burner or burners, and conversely a hot one can have its temperature reduced by turning down the nearest burner or burners. These control functions can be effected manually or automatically to maintain the temperature of the packed tubes within a range of about 25° F. along their entire lengths.

Cane-shaped tubes can be handled the same way. Also an argon washing atmosphere can be maintained throughout most or all of the diffusion coating of Example without significantly different results. Because of its expense, the flow of argon should be reduced to a very small rate by back pressuring it equivalent to 1 to 2 inches of water. Alternatively, that diffusion can be effected in a glass-sealed retort with an autogenously generated atmosphere.

Any of these retort and retort atmosphere arrangements can also be used with slurry coatings or conventional packs to aluminize nickel, platinum and other metals for the purpose of improving their catalytic activity as described in U.S. Pat. No. 3,867,184. Part of the metal surface can also be masked as by the sheath-forming layer directly applied to those parts.

A very effective depletion-preventing slurry is essentially a mixture in the following proportions, of

| | |
|---|---|
| Ni₃Al powder | 40 to 60 grams |
| Cr powder | 4 to 6 grams |

| | |
|---|---|
| alumina powder | 40 to 60 grams | in 50 cc of a 5 to 10% by weight solution of poly(ethylmethacrylate) in methyl chloroform. The powders preferably have particle sizes no greater than about 50 microns, and any other inert powder, such as kaolin, can be used in place of the alumina. About 200 milligrams of non-volatiles per square centimeter are applied from a single dip or a single brushing in such a dispersion, and the dips or brushings repeated to build up the non-volatile weight to about 400 milligrams per square centimeter. This provides very good masking for the diffusion chromizing of alloys containing 10% or more chromium. For chromizing alloys containing less chromium, or for low temperature diffusion coating as with aluminum, the chromium content of the solids in the above slurry can be reduced and can be as low as 1% of all the solids.

The grey appearance of the foregoing mixtures as applied to the substrate, is sometimes difficult to visually distinguish on the substrate. Should it be desirable to make them stand out with more contrast, the mixture can be given some different color, as by substituting dark green $Cr_2O_3$ powder for some or all of the alumina. Substituting $Cr_2O_3$ for as little as one-twelfth of the alumina makes a distinct improvement in the distinguishability of the applied powder-resin layer.

Some aluminas are colored reddish and they can also be used for increasing the contrast in the appearance of the powder resin layer. If desired a little dye can be added to the dispersion for the same purpose. Where two or more different types of layers are built up to make a masking combination as described above, each different type of layer can be given a different color to make them more readily distinguishable.

The masking practiced on the chromized product of Example 2 can also be effecting with a masking composition having the following formulation, the percentages being by weight:

| | | |
|---|---|---|
| Calcined alumina - less than 200 mesh | 25% | |
| Powdered nickel - less than 200 mesh | 56¼% | |
| Powdered prefired mixture of: | | |
| 49.2% alumina powder | | |
| 42.8% nickel powder | | |
| 6.5% aluminum powder | | |
| 1.5% chromium powder | | balance |

The prefired mixture is prepared by prefiring the specified materials in a hydrogen atmosphere at a temperature of 1800° F. for 4 hours, cooling the fired product, and then powdering it to from about minus 100 to about minus 200 mesh size.

The foregoing masking formulation is best slurried into a resin solution as in Example 3 and applied by dipping or brushing.

Alternatively the masking can be accomplished by a two-layer combination in which the first layer is deposited from a similar slurry of the above-described prefired mixture, and an overlying layer deposited from a slurry of that prefired mixture mixed with three times its weight of the powdered nickel. The lower layer can weigh as little as 100 milligrams per square centimeter and the upper layer as little as 200 milligrams per square centimeter.

The solvent used in the resin solution can contain water, although water is not rapidly vaporizable except at ambient temperatures at least as high as about 30° C., preferably 35° C. Water can be the sole solvent, in which case the resin should be a water-soluble one like polyacrylic acid.

Chloroform can also be used as part or all of the solvent, although this makes the solvent more readily volatile and is preferred when working at low ambient temperatures such as 10° C. or lower. Chloroform is considered not as low a health hazard as methyl chloroform.

The various layers in the masking of the present invention can also be applied by spraying. For such application it is preferred to formulate the slurries from which the layers are deposited so that these slurries contain only about 20 to 30 volume percent of suspended solids, or even less. An air stream propelled at a pressure of about 30 pounds per square inch will adequately spray such slurries with internal mix or external mix spray guns, using nozzles and slurry-carrying conduits wide enough to keep from becoming obstructed by the suspended solids.

For spray aplication it is also preferred to have the solid particles suspended in the slurry to be sprayed, not over about 40 microns in size.

Where a sprayed-on layer should have a sharp edge as for example to accurately define its boundary, it is best sprayed on with the help of a cut-out stencil type mask made of a material like teflon or polyethylene, that is resistant to and preferably not wet by the solvents in the sprayed-on slurry. A sheet of such a stencil mask can be wrapped around a cylindrical work surface, or pressed against a flat or gently curved work surface, and the sprayed-on masking lyaer or layers applied to the cut-out portion or portions of the stencil. It is generally not necessary to have the outer masking layers cover the edges of the lower layers, but such covering can be effected by a separate brushing of the appropriate slurry on those edges, or by using stencil masks with slightly larger cut-outs for the outer layers.

Powdered iron is almost as effective as powdered nickel in forming relatively brittle protective sheaths and less costly, and can be substituted for about half or more of the powdered nickel. Where a protective sheath is deposited from a slurry half of whose solids by weight are inert filler, powdered iron can be used up to an amount about equal the weight of the powdered nickel. With lower proportions of inert filler the iron to nickel proportion can be raised up to about 2:1 by weight. Powdered iron is not considered a contaminant for coating on workpieces that contain at least about 25% iron, and when coating workpieces containing less than 1% iron it is preferred to hold the powdered iron content of sheath-forming solids to not over about 10% by weight.

For chromizing at low temperatures, such as 1300° to 1400° F., the masking layer need not contain any inert diluent, but at higher temperatures inert diluent such as alumina or kaolin will keep the masking metal from sintering to the substrate. A mixture of iron powder and alumina in which the alumina content is as high as 90% is suitable for masking a modest chromizing.

The diffusion coating of nickel or DS nickel with chromium or aluminum can be correspondingly masked by a masking layer of nickel powder, preferably containing about 20 to about 90% inert diluent to keep it from sintering to the surface being masked. Other substrates can likewise be masked by a powdered masking layer having the same or essentially the same composition as the substrate. Some substrate ingredients such as carbon, silicon, manganese and aluminum generally do not have to be present in such masking layer to minimize loss of those ingredients from the substrate during a diffusion heat.

Such dispersions can also be applied in the form of pastes that do not flow and can be squeezed out of a syringe or collapsible tube like toothpaste. Thus into a solution of 9 grams of acrylate resin such as poly(ethylmethacrylate) in 100 cc methyl chloroform is stirred 2 grams of colloidal silica particles having a surface area of about 200 square meters per gram. 100 grams of a mixture of finely divided $Ni_3Al$, finely divided chromium, and powdered alumina, in the weight proportion of 10:3:10 is then stirred into the resulting thickened solution to form a paste that can be dispensed from a syringe fitted with a No. 13 needle having an internal bore about 60 mils in diameter.

The paste is dispensed directly onto the workpiece surface to be masked and remains in place. Accurate boundaries for a masked area of any contour are easily followed by such a technique. Moreover, the desired amount of masking mixture can be applied as a single layer of paste that can be as much as 60 mils thick, so that multiple dipping as described in Ser. No. 242,350 is not needed. Even thicker layers can be applied by using needles with larger bores, or by extruding the paste through a toothpaste tube. In general a paste thickness of at least about 10 mils is preferred.

Where two or more layers of different masking compositions are used one above another, as described in Ser. No. 242,350, corresponding layers of suitably formulated paste can be used.

The extruded pastes lose much of their volatile solvent on standing a few minutes, and this evaporation changes the pastes to very hard layers that withstand the mechanical treatment needed to embed the masked workpieces in a diffusion coating pack. For this purpose at least about 95% of the liquid content of a paste should be volatilizable within about 5 minutes after the paste is extruded.

Other thickening agents can be used, as well as other solvents and other resins, to make the pastes. To make an article of commerce the pastes are desirably formulated with the masking powder in one container, and the balance of the paste in another, so that the purchaser can mix them together fresh for use. A pre-mixed masking-powder-containing paste can be subject to settling over very long periods of time inasmuch as some of the powder is a metal of high specific gravity.

The foregoing maskings can also be used when diffusion coating is effected as a gas phase treatment, such as described in parent applications Ser. Nos. 230,333 and 89,949, as well as in U.S. Pat. No. 4,148,275. However the presence of a large quantity of resin-containing masking mixtures in a diffusion-coating retort can detract from the quality and effectiveness of gas-phase diffusion coatings.

Figure 1:
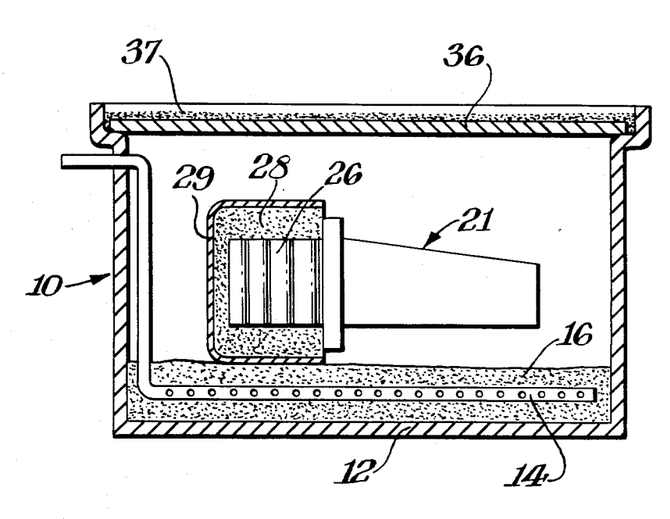

Accordingly when conducting a masked gas-phase diffusion coating it is desirable to mask the workpieces by embedding the surfaces to be masked in a resin-free masking powder, as in parent U.S. Pat. Nos. 3,764,371 and 3,801,357. The drawing FIGURE of the present application shows such a technique.

In the FIGURE, a box-like diffusion coating retort 10 has its floor 12 covered with a layer of diffusion coating powder 16 as described in Ser. No. 230,333 (U.S. Pat. No. 4,347,267) the contents of which application are incorporated herein as though fully set forth. It will be noted however that in the formulation of the aluminizing powder on that floor in Example 1 of Ser. No. 230,333, the second ingredient should be —alumina— rather than "aluminum". This error has been corrected in the '267 patent.

Over the top of the powder is placed a group of jet engine blades 21, each having its root 26 embedded in a masking powder 28 held in a small cup-shaped steel container 29. The powder is tamped in well and will then hold the blade securely even though cup 29 is placed on its side and the blade axis extends horizontally. The cup preferably has a flat side on which it rests, so as to keep from rolling when the retort is tilted, or the cup can be embedded a short distance into powder layer 16.

A cover 36 is loosely fitted over the retort box 10, and the edges of the cover packed with asbestos fibers or rope to sharply limit gas flow into and out of the box past the cover. A perforated tube 14 can be positioned within or under floor layer 16 and led to the outside of the box so that a gas such as argon or hydrogen can be slowly introduced through the floor powder and escape past the cover.

Blades of B-1900 alloy so embedded in a nickel aluminide-chromium-alumina masking powder as described in U.S. Pat. No. 3,801,357, have their airfoil surfaces very effectively aluminized with the aluminizing mixture of Example 1 in the '267 patent, when held at 1800° to 1850° F. for 8 hours, with a barely perceptable flow of hydrogen.

The same technique can be used with blades that have internal passageways. In the event it is important to have the passageway walls also effectively diffusion coated, those passageways are pre-filled with diffusion coating slurry or dry powder, as also described in Ser. No. 230,333. The passageway coatings can alternatively be diffusion coated by the technique described in U.S. Pat. No. 4,148,275.

Argon can be used in place of or in addition to hydrogen as the flushing gas, and the flow of gas can be completely eliminated in which case the retort can be placed within an outer retort through which an inert gas is slowly flushed. In the absence of injected gas, the diffusion coating formed is of the outward diffusion type, rather than the inward diffusion type, and outward diffusion type coatings are preferred in many cases. A discussion of such comparative diffusion coatings is contained in Ser. No. 230,333.

Instead of using an essentially completely inert gas like hydrogen or argon, a halide-containing gas can be injected through the tube 14, as by flowing such inert gas through a container holding heated aluminum chloride, before the gas is injected into the retort. Gas introduced this way carries along aluminum chloride vapors that help provide outward diffusion type of diffusion coatings.

Keeping the surfaces to be diffusion coated close to the powder layer 16, helps speed the coating operation and provides more desirable diffusion coatings. A three-inch spacing from that floor powder should not be exceeded, for such improved results. However surfaces spaced as much as eight inches from the floor receive acceptable aluminum diffusion coatings.

The cups 29 can be stood upright on the powder layer 16, or can be partially or completely embedded in that layer to hold workpieces elevated at any desired angle above that layer. Indeed the cups themselves can be omitted and pockets of masking powder provided in the floor layer. When cups are used they can be made of ordinary low-carbon steel, preferably pre-treated to diffusion coat their outer surfaces with the same metal which is to be used to diffusion coat the workpieces.

Powder-pack masking during a gas-phase diffusion coating is a particularly desirable and effective combination. The absence of resin enables the efficient and economical crowding of many workpieces in retorts and yields very uniform and complete coatings on the non-masked surfaces, regardless of the nature of the metal substrate and regardless of the metal being deposited on the substrate. Gas-phase aluminizing of powder-pack masked superalloys is exceptionally desirable inasmuch as the aluminum "throws" long distances through the vapor phase.

The resin content of the resin-containing mixtures of Examples 1, 3 and 4 can be sharply reduced to enable crowding of workpieces in a retort without serious detraction from the resulting coating quality. A resin content not over about 1% by weight of the masking mixtures is a good limit for this purpose, and can also be observed in the preparation of the masking pastes. The effectiveness of the low-resin mixtures can be increased by also incorporating in those mixtures some inert inorganic binder such as bentonite, or using it in place of all the organic binder.

A resin like nitrocellulose that contains in its molecule all the oxygen needed to burn up the molecule, has the least effect on the quality of diffusion coatings.

Obviously many modifications and variations of the present invention are possible in the light of the above teachings. It is, therefore, to be understood that within the scope of the appended claims the invention may be practiced otherwise than as specifically described.

What is claimed:

1. A composition for masking against diffusion coating, the composition consisting essentially of a used diffusion-chromizing pack which before that use contained from about 0.6 to about 2% chromium, a nickel content from about ½ to about 3 times the chromium content, and an aluminum content about 1/10 to about ⅓ the chromium content.

2. In the diffusion aluminizing of a portion of the surface of a metal workpiece at a temperature not over 1400° F., while masking the remainder of the surface against such aluminizing, the improvement according to which the masking is an adherent layer of the composition of claim 2.

3. A composition for masking against diffusion coating, the composition consisting essentially of a used single-use diffusion-chromizing pack which before that single use contained refractory diluent mixed with about 1.2% chromium, about 2.4% nickel and about 0.37% aluminum.

4. The composition of claim 2 mixed with sufficient binder and solvent to make an adherent coating mixture.

5. The composition of claim 3 mixed with sufficient binder and solvent to make an adherent coating mixture.

6. A single-use diffusion-chromizing composition consisting essentially of refractory diluent mixed with from about 0.6 to about 2% chromium, nickel in an amount from about ½ to about 3 times the chromium content, and aluminum in an amount from about 1/10 to about ⅓ the chromium content.

* * * * *